(12) United States Patent
Veillette

(10) Patent No.: US 6,798,291 B2
(45) Date of Patent: Sep. 28, 2004

(54) VARIABLE GAIN CURRENT AMPLIFIER WITH A FEEDBACK LOOP INCLUDING A DIFFERENTIAL PAIR

(75) Inventor: Benoit R. Veillette, Shrub Oak, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/293,990

(22) Filed: Nov. 12, 2002

(65) Prior Publication Data

US 2004/0090269 A1 May 13, 2004

(51) Int. Cl.[7] .............................................. H03F 3/45
(52) U.S. Cl. .................................. 330/254; 330/260
(58) Field of Search .............................. 330/254, 256, 330/260; 327/359, 563

(56) References Cited

U.S. PATENT DOCUMENTS

| 3,908,172 A | * | 9/1975 | Aschermann et al. ....... 330/254 |
| 3,921,091 A | * | 11/1975 | Van Kessel et al. ........ 330/254 |
| 5,572,166 A | | 11/1996 | Gilbert ....................... 330/254 |
| 5,619,169 A | | 4/1997 | Matsuura .................... 330/254 |
| 5,684,431 A | | 11/1997 | Gilbert et al. .............. 330/254 |
| 6,084,471 A | | 7/2000 | Ruth, Jr. et al. ............ 330/254 |
| 6,169,452 B1 | | 1/2001 | Popescu et al. ............. 330/254 |

FOREIGN PATENT DOCUMENTS

JP          5-48358      *  2/1993

* cited by examiner

Primary Examiner—Henry Choe
(74) Attorney, Agent, or Firm—Aaron Waxler

(57) ABSTRACT

The present invention is directed to a current amplifier. The current amplifier according to the present invention includes a voltage amplifier with a predetermined gain, an input and an output. A transistor is connected to the output of the voltage amplifier. A differential pair of transistors is connected between the transistor and the input of the voltage amplifier. The gain of the current amplifier varies according to the to the voltage applied to the input of the differential pair of transistors. Further, a current through the transistor will be divided into a feedback current and an output current according to the voltage applied to the input of the differential pair of transistors.

10 Claims, 2 Drawing Sheets

VARIABLE GAIN CURRENT AMPLIFIER WITH A FEEDBACK LOOP INCLUDING A DIFFERENTIAL PAIR

BACKGROUND OF THE INVENTION

The present invention relates generally to amplifier circuits, and in more particular, to a variable gain current amplifier circuit that includes a differential pair in a feedback loop.

Variable gain amplifiers are used in many systems. For example, communication systems such as wireless phones and ultrasound imaging systems are two applications that rely on variable gain amplification to improve performance. Variable gain amplification allows an output signal of the amplifier to use the full range of the amplitude, which minimizes the effects of noise and distortion. An example of this is shown in FIG. 1. As can be seen, the top input signal needs to be attenuated, while the bottom input signal needs to be amplified.

Variable gain amplifiers may be based on voltage, current or charge. Voltage mode amplifiers are probably the most widely used. Examples of such include complex circuits where the amplification is provided by discrete transconductance stages. However, due to the requirements of modern digital circuits, integrated circuit fabrication processes have resulted in semiconductor devices with lower breakdown voltages. This has enabled supply of these integrated circuits to be continually lowered. Although, this development has adversely effected voltage mode amplifiers since the dynamic range of such circuits have been reduced.

Charge mode amplifiers are one alternative. However, such a circuit utilizes a discrete time technique that is not suitable for high-speed operation. In contrast, current mode amplifiers are less constrained by reduced power supplies and are able to operate at very high speeds. However, these circuits currently suffer from other drawbacks.

For example, a differential pair circuit may be used as a current mode variable gain amplifier. However, this circuit is only capable of attenuating signals and not amplifying. A fixed gain amplifier could be placed in front of a differential pair in order to provide a wider range of gains. However, this approach would waste power.

Another type of current mode variable gain amplifier relies on the exponential relationship between the base-emitter voltage and collector current of a bipolar transistor. However, this circuit is to sensitive to the emitter resistance of the bipolar transistor, which could cause gain errors and distortion.

SUMMARY OF THE INVENTION

The present invention is directed to a current amplifier. The current amplifier according to the present invention includes a voltage amplifier with a predetermined gain, an input and an output. A transistor is connected to the output of the voltage amplifier. A differential pair of transistors is connected between the transistor and the input of the voltage amplifier. The gain of the current amplifier varies according to the to the voltage applied to the input of the differential pair of transistors. Further, a current through the transistor will be divided into a feedback current and an output current according to the voltage applied to the input of the differential pair of transistors.

The present invention is also directed to a method of amplifying a current. The method according to the present invention includes a voltage being developed that is proportional to the current. The voltage is amplified according to a predetermined gain to produce an amplified voltage. A second current is produced that is proportional to the amplified voltage. Further, the second current is divided into a feedback current and an output current according to a control voltage.

Figure 1:
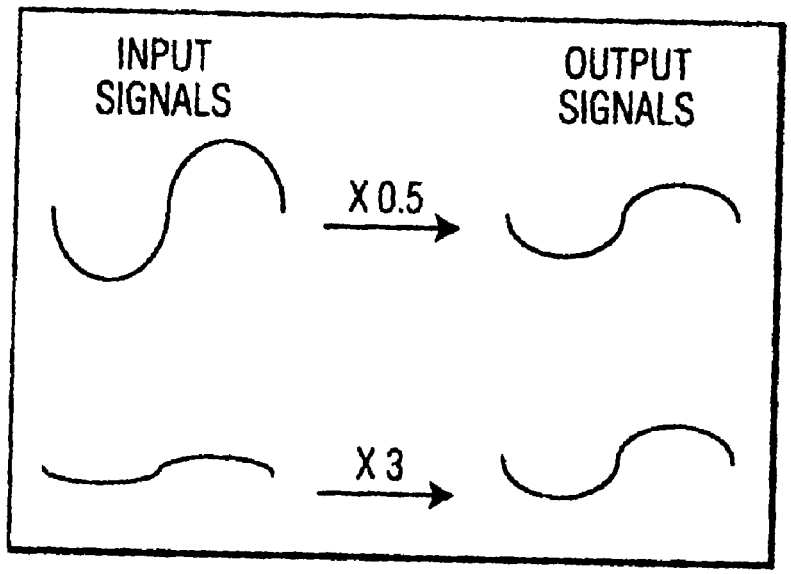
FIG. 1 is a diagram illustrating the use of a variable gain amplifier.

It is to be understood that these drawings are solely for purposes of illustrating the concepts of the invention and are not intended as a definition of the limits of the invention. It will be appreciated that the same reference numerals, possibly supplemented with reference characters where appropriate, have been used throughout to identify corresponding parts.

DETAILED DESCRIPTION

Figure 2:
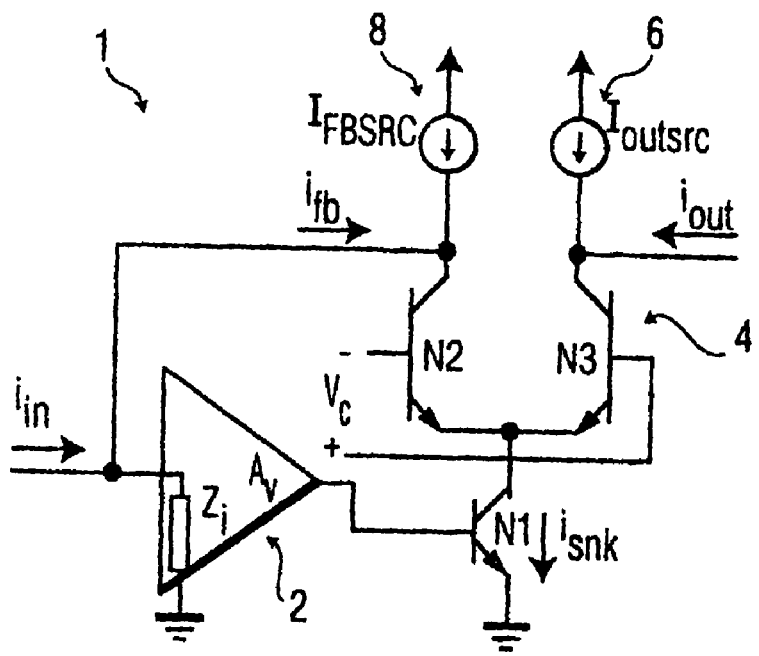
FIG. 2 is a diagram of one embodiment of a variable gain current amplifier according to the present invention.

One embodiment of a variable gain current amplifier according to the present invention is shown in FIG. 2. As can be seen, the variable gain current amplifier 1 includes a voltage amplifier 2 with input impedance $Z_i$ and a predetermined gain $A_v$. A transistor N1 is connected to the output of the amplifier 2. The transistor N1 acts as a current sink to produce a current $i_{snk}$ that is proportional to the output voltage of the amplifier 2.

As can be further seen, a differential pair of transistors 4 is connected between the transistor N1 and the input of the amplifier 2. In particular, the differential pair 4 includes two transistors N2, N3 that have commonly connected emitters. The emitters of the two transistors N1, N2 are also connected to the collector of the lower transistor N1. Further, the collector of the left most transistor N2 is connected to the input of the voltage amplifier 2. In this embodiment, transistors N1, N2, N3 are NPN bipolar transistors. However, the present invention includes the use of other types of devices such as PNP bipolar transistors or field effect transistors.

The differential pair 4 is utilized in order to set the ratio of the output current $i_{out}$ and feedback current $i_{fb}$ according to a control voltage $v_c$. This will enable the current gain of the amplifier 1 to be controlled by the control voltage $v_c$, which is applied to the input of the differential pair 4. The current gain is calculated by dividing the output current $i_{out}$ by the input current $i_{in}$.

As can be further seen from FIG. 2, current sources 6,8 are each coupled to/the collectors of transistors N2, N3 of the differential pair 4. These current sources 6,8 provide DC bias current $I_{FBSRC}, I_{OUTSRC}$ for the differential pair 4 that enables the feedback and output current $i_{fb}, i_{out}$ to have negative values.

During operation, the difference between the input current $i_{in}$ and the feedback current $i_{fb}$ is felt at the input of the voltage amplifier 2. A voltage will be developed across the input impedance $Z_i$ of the amplifier 2. This voltage will be amplified according to the gain $A_v$ of the amplifier 2 and will be felt at the input of the lower transistor N1. This will cause the lower transistor N1 to conduct current $i_{snk}$ to ground. The current $i_{snk}$ is divided between the feedback current $i_{fb}$ and the output current $i_{out}$ according to the control voltage $v_c$ applied to the input of the differential pair 4. The current $i_{snk}$ is defined as:

$$i_{snk} = (i_{in} - i_{fb}) Z_f A_v g_m \quad (1)$$

where $g_m$ is the transconductance of the lower transistor N1. Thus, the current through the differential pair 4 is defined as:

$$i_{fb} = \frac{i_{snk}}{1 + e^{+vc/VT}} - I_{FBSRC} \quad (2)$$

$$i_{out} = \frac{i_{snk}}{1 + e^{-vc/VT}} - I_{OUTSRC} \quad (3)$$

where e is the exponential function and $V_T$ is thermal voltage of the bipolar transistors. By combining equations (1) and (2), the feedback current is defined as:

$$i_{fb} = \frac{Z_1 A_v g_m}{1 + e^{+vc/VT} + Z_1 A_v g_m} i_n - \frac{1 + e^{+vc/VT}}{1 + e^{+vc/VT} + Z_1 A_v g_m} I_{FBRSC} \quad (4)$$

By combining equations (1), (3) and (4), the output current $i_{out}$ is defined as:

$$i_{out} = \frac{Z_1 A_v g_m (1 + e^{+vc/VT})}{(1 + e^{+vc/VT} + Z_1 A_v g_m)(1 + e^{+vc/VT})} (i_{in} - I_{FBSRC}) - i_{OUTSRC} \quad (5)$$

Since the current gain $Z_i A_v g_m$ is much larger than unity, the overall current gain $A_c$ is defined as:

$$A_c = \frac{i_{out}}{i_{in}} \approx \frac{1 + e^{+vc/VT}}{1 + e^{+vc/VT}} = e^{+vc/VT} \quad (6)$$

According to equation (6), the gain of the current amplifier 1 changes exponentially according to the control voltage $v_c$ applied at the input of the differential pair 4. The gain can either be smaller than unity (attenuation) or larger than unity (amplification). Further, since this gain is exponential, the dynamic range and control is also increased.

Figure 3:
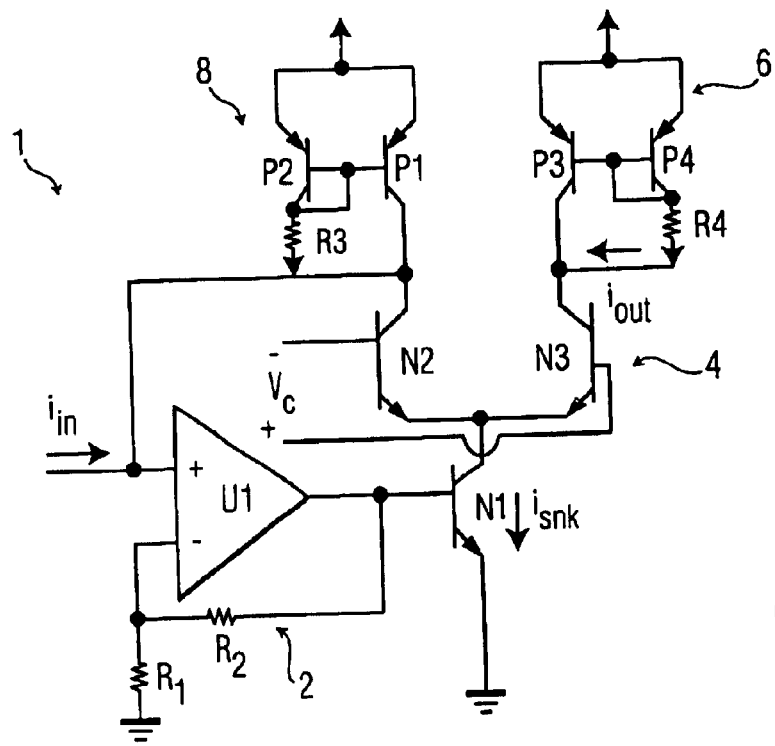
FIG. 3 is a diagram of a more detailed embodiment of a variable gain current amplifier according to the present invention; and, FIG. 4 is a diagram of another more detailed embodiment of a variable gain current amplifier according to the present invention.

A more detailed embodiment of a variable gain current amplifier according to the present invention is shown in FIG. 3. In this embodiment, the voltage amplifier 2 is implemented with an operational amplifier U1 and two resistors R2, R1. In this implementation, the gain is positive and is determined by the resistors R1,R2.

In this embodiment, the current source 8 is implemented using two PNP transistors P1, P2 and a resistor R3. Similarly, the right current source 6 is implemented with two PNP transistors P3, P4 and a resistor R4. During operation, both current sources will operate similarly. For example, in the left current source 8, the resistor R3 will convert a voltage difference into a current. This current will conduct through the left transistor P2 setting the emitter base voltage of both transistors P1, P2 to the same value. Therefore, the current conducting out of the collector of the right transistor P1 will mirror the current in the resistor R3 if both transistors P1, P2 are equal sized.

Figure 4:
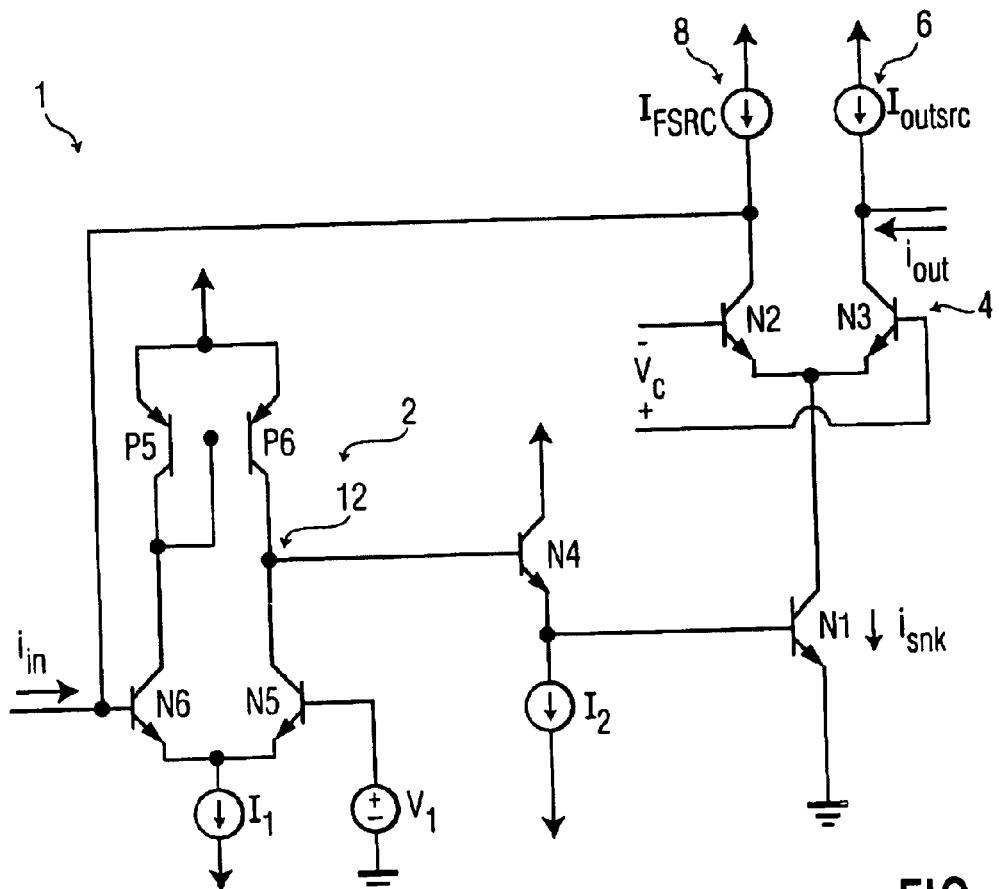

Another more detailed embodiment of a variable gain current amplifier according to the present invention is shown in FIG. 4. In this embodiment, the voltage amplifier 2 is implemented by a discrete transistor circuit. In particular, the voltage amplifier 2 has a first stage including a differential pair N5, N6 connected to a current mirror P5, P6, as shown. A voltage source is connected to a base of one of the transistors. The differential pair N5, N6 provides a differential current gain that is set by the current source $I_1$. The current mirror P5, P6 converges the differential current into a single node 12 to modify the output voltage developed at that point.

The voltage amplifier 2 also has a second stage connected to the output 12 of first stage. The second stage includes another transistor N4 coupled to another current source I2, as shown. The second stage will buffer the first stage from the output in order to achieve a higher gain. In this embodiment, the current sources 6,8 may be implemented as shown in FIG. 3.

Moreover, in other embodiments of the invention, some or all of the functions of the variable gain current amplifier may be combined into a single device. For example, one or more of the elements of amplifier may be implemented as an application specific integrated circuit (ASIC).

In the proceeding description, for purposes of explanation rather than limitation, specific details were set forth in order to provide a thorough understanding of the present invention. However, it will be apparent to those skilled in the art that the present invention may be practiced in other embodiments, which depart from these specific details. Moreover, for the purpose of clarity, detailed descriptions of well-known devices, circuits, and methods are omitted so as not to obscure the description of the present invention with unnecessary detail.

What is claimed is:

1. A current amplifier, comprising:
   a voltage amplifier with a predetermined gain, an input and an output;
   a current sink comprising a transistor connected to the output of the voltage amplifier and having a sink current to ground that is proportional to the output voltage of the voltage amplifier; and
   a differential pair of transistors connected between the transistor and the input of the voltage amplifier.

2. The current amplifier of claim 1, wherein the gain of the current amplifier varies according a control voltage applied to the input of the differential pair of transistors, and wherein the current gain ranges from attenuation to amplification depending on the value of the control voltage applied.

3. The current amplifier according to claim 1, wherein a current through the transistor will be divided into a feedback current and an output current according to a voltage applied to the input of the differential pair of transistors.

4. The current amplifier of claim 1, wherein the gain $A_c$ of the current amplifier is defined by the following equation:

$$A_c \sim e^{+vc/VT}$$

where e is the exponential function, $v_c$ is a control voltage and $V_T$ is thermal voltage of the bipolar transistors.

5. The current amplifier of claim 1, wherein the current sink comprises is a bipolar transistor.

6. The current amplifier of claim 5, wherein the output of the voltage amplifier is connected to a base of the bipolar transistor.

7. The current amplifier of claim 6, wherein the differential pair of transistors is a second bipolar transistor and a third bipolar transistor.

8. The current amplifier of claim 1, wherein the transistor is a field effect transistor.

9. The current amplifier of claim 1, wherein the output of the voltage amplifier is connected to a gate of the field effect transistor.

10. A method of amplifying a current, comprising the steps of:

developing a voltage proportional to the current difference;

amplifying the voltage according to a predetermined gain to produce an amplified voltage;

producing a second current comprising a sink current proportional to the amplified voltage; and dividing the second current into a feedback current and an output current according to a control voltage, and varying the control voltage to cause the gain of the output current to range from attenuation to amplification.

* * * * *